United States Patent
Wago

(10) Patent No.: US 7,642,041 B2
(45) Date of Patent: Jan. 5, 2010

(54) ROTARY APERTURED INTERFEROMETRIC LITHOGRAPHY (RAIL)

(75) Inventor: Koichi Wago, Sunnyvale, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 2 days.

(21) Appl. No.: 11/955,905

(22) Filed: Dec. 13, 2007

(65) Prior Publication Data

US 2008/0124658 A1 May 29, 2008

Related U.S. Application Data

(62) Division of application No. 10/665,275, filed on Sep. 22, 2003, now Pat. No. 7,459,241.

(51) Int. Cl.
*G03H 1/02* (2006.01)

(52) U.S. Cl. ............... 430/321; 430/1; 430/2; 430/320; 430/324; 430/323; 359/35

(58) Field of Classification Search ............ None
See application file for complete search history.

(56) References Cited

U.S. PATENT DOCUMENTS

| | | |
|---|---|---|
| 3,953,105 A | 4/1976 | Ih |
| 4,550,395 A | 10/1985 | Carlson |
| 4,626,062 A | 12/1986 | Ishikawa |
| 4,712,852 A | 12/1987 | Funato et al. |
| 4,747,646 A | 5/1988 | Andrews |
| 4,840,443 A | 6/1989 | Debesis |
| 5,061,025 A | 10/1991 | Debesis |
| 5,142,385 A | 8/1992 | Anderson et al. |
| 5,843,626 A | 12/1998 | Ohta et al. |
| 5,892,597 A | 4/1999 | Iwata et al. |
| 6,190,748 B1 | 2/2001 | Xavier et al. |
| 6,233,044 B1 | 5/2001 | Brueck et al. |
| 6,529,463 B1 | 3/2003 | Goodberlet |
| 6,748,865 B2 * | 6/2004 | Sakurai et al. ............. 101/483 |
| 2002/0051306 A1 * | 5/2002 | Nishikawa et al. ........... 360/17 |

FOREIGN PATENT DOCUMENTS

| | | |
|---|---|---|
| JP | 58-094149 | 6/1983 |
| JP | 01-315048 | 12/1989 |
| JP | 2001-111776 | 4/2001 |

(Continued)

OTHER PUBLICATIONS

Ishida et al., "Demodulation of servo tracking signals printed lithographically patterned master disk", IEEE Trans.,Magnet., vol. 37(4) pp. 1412-1415 (Jul. 2001).*

(Continued)

*Primary Examiner*—Martin J Angebranndt
(74) *Attorney, Agent, or Firm*—Shumaker & Sieffet, P.A.

(57) ABSTRACT

A rotary apertured interferometric lithography (RAIL) system that includes interferometric lithography tools, a mask with a slit preferably with an arc shape, and a rotating stage is disclosed. The RAIL system could create a servo pattern of a recording-head trajectory of a hard disk drive in a master for magnetic-contact printing. The master can could be used to form arrays of sub-micron sized magnetic elements on a magnetic disk media for high-density magnetic recording applications.

17 Claims, 3 Drawing Sheets

FOREIGN PATENT DOCUMENTS

WO          99/63371          12/1999

OTHER PUBLICATIONS

Sato et al. "Magnetic printing technology", Fuji Elect. Rev., vol. 48(3) pp. 77-82 (2002).*

Ishida et al. "Magnetic Printing Technology-application to HDD", IEEE Trans. Magnet., vol. 39(2) pp. 628-632 (Mar. 2003).*

Anderson et al., "Achromatic holographic lithography in the dep ultraviolet", J. Vac., Sci. Technol., B vol. 6(1) pp. 216-218 (1988).*

"Holographically generated high resolutiontrack servo pattern for optical or capacitive readout". IBM Tech. Discl. Bull. 26(6): 2951-2952, Nov. 1983.

Savas, et al., 1996. "Large area achromatic interferometric lithography for 100 nm period gratings and grids". J. Vac. Sci., Technol. B. 14(6): 4167-4170.

Savas, et al., 1995. "Achromatic interferometric lithography for 100-nm-period gratings and grids". J. Vac. Sci., Technol. B. 13(6): 2732-2735.

* cited by examiner $$\text{period} = \frac{\lambda}{2\sin\theta}$$

ROTARY APERTURED INTERFEROMETRIC LITHOGRAPHY (RAIL)

RELATED APPLICATIONS

This is a divisional of application Ser. No. 10/665,275, filed on Sep. 22, 2003, now U.S. Pat. No. 7,459,241.

FIELD OF INVENTION

The present invention relates to master for creating a magnetic pattern on a magnetic media.

BACKGROUND

Magnetic disks and disk drives are conventionally employed for storing data in magnetizable form. Preferably, one or more disks are rotated on a central axis in combination with data transducing heads positioned in close proximity to the recording surfaces of the disks and moved generally radially with respect thereto. Magnetic disks are usually housed in a magnetic disk unit in a stationary state with a magnetic head having a specific load elastically in contact with and pressed against the surface of the disk. Data are written onto and read from a rapidly rotating recording disk by means of a magnetic head transducer assembly that flies closely over the surface of the disk. Preferably, each face of each disk will have its own independent head.

Disc drives at their most basic level work on the same mechanical principles as media such as compact discs or even records, however, magnetic disc drives can write and read information much more quickly than compact discs (or records for that matter!). The specific data is placed on a rotating platter and information is then read or written via a head that moves across the platter as it spins. Records do this in an analog fashion where the disc's grooves pick up various vibrations that then translate to audio signals, and compact discs use a laser to pick up and write information optically.

In a magnetic disc drive, however, digital information (expressed as combinations of "0's" and "1's") is written on tiny magnetic bits (which themselves are made up of many even smaller grains). When a bit is written, a magnetic field produced by the disc drive's head orients the bit's magnetization in a particular direction, corresponding to either a 0 or 1. The magnetism in the head in essence "flips" the magnetization in the bit between two stable orientations. In currently produced hard disc drives, longitudinal recording is used. In longitudinal recording, the magnetization in the bits is flipped between lying parallel and anti-parallel to the direction in which the head is moving relative to the disc.

Newer longitudinal recording methods could allow beyond 100 gigabits per square inch in density. A great challenge however is maintaining a strong signal-to-noise ratio for the bits recorded on the media. When the bit size is reduced, the signal-to-noise ratio is decreased, making the bits more difficult to detect, as well as more difficult to keep stable.

Perpendicular recording could enable one to record bits at a higher density than longitudinal recording, because it can produce higher magnetic fields in the recording medium. In perpendicular recording, the magnetization of the disc, instead of lying in the disc's plane as it does in longitudinal recording, stands on end perpendicular to the plane of the disc. The bits are then represented as regions of upward or downward directed magnetization (corresponding to the 1's and 0's of the digital data).

Increasing areal densities within disc drives is no small task. For the past few years, technologists have been increasing areal densities in longitudinal recording at a rate in excess of 100% per year. But it is becoming more challenging to increase areal densities, and this rate is expected to eventually slow until new magnetic recording methods are developed.

To continue pushing areal densities in recording and increase overall storage capacity, the data bits must be made smaller and put closer together. However, there are limits to how small the bits may be made. If the bit becomes too small, the magnetic energy holding the bit in place may become so small that thermal energy may cause it to demagnetize over time. This phenomenon is known as superparamagnetism. To avoid superparamagnetic effects, disc media manufacturers have been increasing the coercivity (the "field" required to write a bit) of the disc.

In magnetic disk, "servo sectors" are pre-written to define data tracks. Traditionally, servo-sectors were written by a tool called servo-track writer. There is also a method to write servo sectors by means of magnetic-contact printing, to which the RAIL invention is related to. In magnetic disk media, there is a sector called "servo-sector" where the disk manufacturer prints data for the operation of the disk using a master by an imaging process. The servo-sector typically occupies about 5-10% of the disk capacity. As the areal density increases it is also desirable to decrease the size of the servo-sector. This decrease in the size of the servo-sector could be brought about by increases in the imaging process, known as patterning, for making the master.

Patterning is an operation that removes specific portions on the surface of the master. Photolithography is one of the terms used to identify the operation of patterning. Other terms used are photomasking, masking, microlithography and interference lithography.

Patterning is one of the important operations in disk media manufacturing. The goal of the operation is twofold. First, is to create in and on the master surface a pattern whose dimensions are as close to as the resolution of the images on the master. The pattern dimensions are referred to as the feature sizes or image sizes of the pattern. The second goal is the correct placement (called alignment or registration) of the pattern on the master. The entire pattern must be correctly placed on the master and the individual parts of the pattern must be in the correct positions relative to each other.

Lithography is a pattern transfer process similar to photography and stenciling. In the field of mastering the servo-patterned media (SPM), laser-beam and electron beam lithography are mature technologies. The system consists of an electron source that produces a small-diameter spot and a "blanker" capable of turning the beam on and off. The exposure must take place in a vacuum to prevent air molecules from interfering with the electron beam. The beam passes through electrostatic plates capable of directing (or steering) the beam in the x-y direction on the SPM. This system is functionally similar to the beam steering mechanisms of a television set. Precise direction of the beam requires that the beam travel in a vacuum chamber in which there is the electron beam source, support mechanisms, and the substrate being exposed. Since the pattern required generates from the computer, there is no mask. The beam is directed to specific positions on the surface by the deflection subsystem and the beam turned on where a photoresist (also called a resist) is to be exposed. Larger substrates are mounted on an x-y stage and are moved under the beam to achieve full surface exposure. This alignment and exposure technique is called direct writing.

The pattern is exposed in the resist by either raster or vector scanning. Raster scanning is the movement of the electron beam side-to-side and down the wafer. The computer directs the movement and activates the blanker in the regions where the resist is to be exposed. One drawback to raster scanning is the time required for the beam to scan, since it must travel over the entire surface. In vector scanning, the beam is moved directly to the regions that have to be exposed. At each location, small square or rectangular shaped areas are exposed, building up the desired shape of the exposed area.

However, with the x-y stage-based lithography tools, accurate r-θ position control was difficult which led to the development of the electron-beam recorder with a rotating stage and a linear controller, which provided with an accurate r-θ position control. The r-θ position controlled lithography also made it possible to define small features, determined mainly by the beam-spot size, which is important for making a master for SPM as the density increases. One requirement for the SPM master is an accurate trackpitch control. It is affected by factors such as vibration, random beam deflection due to disturbances, precision and stability of linear actuator control. Despite extensive engineering efforts, it is difficult to achieve trackpitch variation (3σ) less than 10 nm, which is required for the SPM master for hard disks at 200 kTPI (tracks per inch). The limitation is mainly due to inability to control the beam position relative to the wafer (substrate) accurately, affected by the factors mentioned above. Another disadvantage of the e-beam lithography is the slow throughput.

On the other hand, there exists a technology called interferometric lithography. It can make fine periodic patterns, but it could not make patterns required for the SPM master, consisting of synchronous fields, position-error-signal (PES) bursts, and so on, in an arc shape representing head movement with a rotary actuator in a hard-disk drive.

SUMMARY OF THE INVENTION

This invention preferably relates to a rotary apertured interferometric lithography (RAIL) system that includes interferometric lithography tools, a mask with a slit, preferably with an arc shape, and a rotating stage. One embodiment is a rotary apertured interferometric lithography (RAIL) system comprising an interferometric tool, a rotating stage and a mask having an aperture that creates a servo pattern in a master for magnetic-contact printing. Preferably, the servo-pattern tracks a recording-head trajectory of a hard disk drive. Another embodiment of the RAIL system further comprises a phase shifter that controls a position of an interference fringe. Preferably, the aperture is an arc-shaped slit. Preferably, the RAIL system comprises a laser beam and the system forms a trackpitch determined by a wavelength of a laser of the laser beam and an incident angle of the laser beam. Preferably, the master has a feature having a size of less than 0.35 micron and a standard deviation of a period of less than 1 nm.

Another embodiment is a master having a feature having a standard deviation of a period of less than 1 nm, the master being a master for magnetic-contact printing. Preferably, the master contains a servo-pattern that tracks a recording-head trajectory of a hard disk drive. Preferably, the feature has a size of less than 0.35 micron.

Yet another embodiment is a method of manufacturing a master comprising applying a resist to a substrate, patterning the resist by interferometric lithography to form a patterned resist, and depositing a metal on the patterned resist, wherein the master has a feature having a standard deviation of a period of less than 1 nm and the master is a master for magnetic-contact printing. Preferably, the depositing a metal comprises sputtering depositing a metal layer and subsequently electroplating a metal film on the metal layer. Further preferably, the patterning the resist comprises exposing the resist to a laser beam and developing the resist. In one embodiment, the patterned resist contains depressions of different depths.

Another embodiment is a method of forming a servo-sector in a magnetic disk medium comprising contacting a master having a feature having a standard deviation of less than 1 nm to the magnetic disk medium and exposing the master to a magnetic field. Preferably, the exposing the master to a magnetic field creates a magnetic pattern in a magnetic layer of the magnetic disk medium.

Additional advantages of this invention will become readily apparent to those skilled in this art from the following detailed description, wherein only the preferred embodiments of this invention is shown and described, simply by way of illustration of the best mode contemplated for carrying out this invention. As will be realized, this invention is capable of other and different embodiments, and its details are capable of modifications in various obvious respects, all without departing from this invention. Accordingly, the drawings and description are to be regarded as illustrative in nature and not as restrictive.

DETAILED DESCRIPTION

Figure 1:
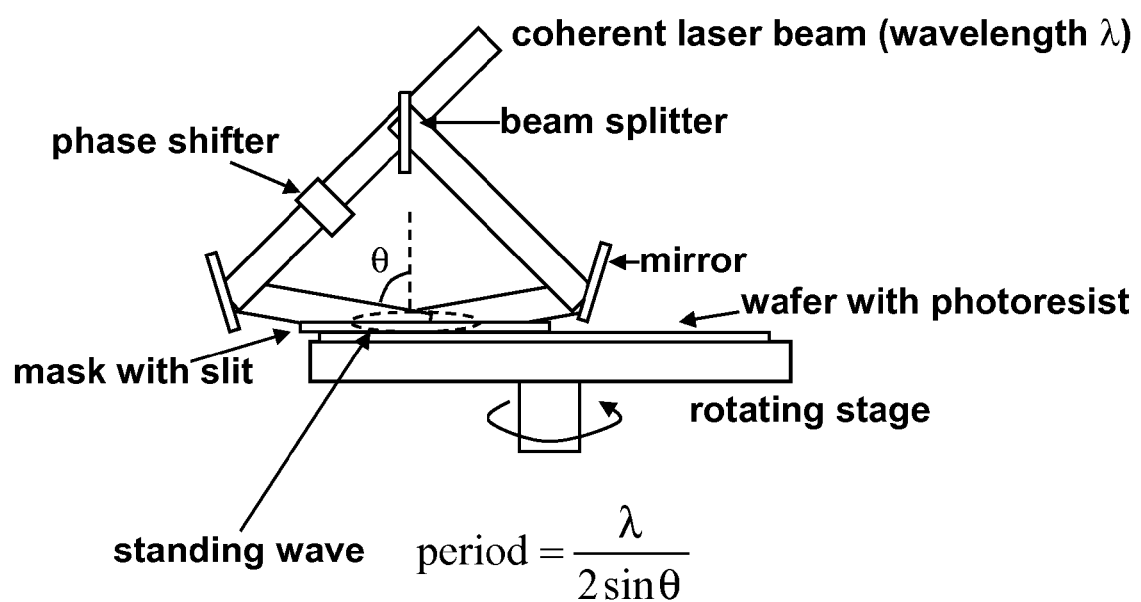
FIG. 1 shows a side view of an embodiment of the RAIL system.

This invention differs from prior systems by allowing precise trackpitch determined by the wavelength of the laser used and the incident angle of two beams, with much better trackpitch variation than the prior systems. It can make patterns required for the master for Contact-print Servo Patterned Media (CSPM).

The method of performing RAIL and calibrating MR head geometry in self-servo writing disc drives is described in the U.S. Pat. No. 6,317,285 incorporated herein by reference.

For the master of CSPM, one preferred requirement is the trackpitch variation, and it is determined by the interference optics and not affected by the environmental disturbance significantly in the present invention.

The present invention has an additional benefit of reducing the time required for recording a master, since it can be done in a single rotation of the rotating stage, as opposed to hundreds of thousands of rotations required in the prior arts using a LBR or EBR.

Briefly, the RAIL process is the following. The required pattern is first formed in reticles or photomasks and transferred into the surface layer(s) of master through a photomasking steps. The transfer takes place in several steps. First, the pattern on the mask is transferred into a layer of a photoresist spread out on a smooth, solid surface such as that of a silicon wafer or a glass plate. Photoresist is a light-sensitive material similar to the coating on a regular photographic film. Exposure of light (or laser) causes changes in its structure and properties. In one type, for example the negative photoresist, the photoresist in the region exposed to the light is changed from a soluble material to an insoluble material. The soluble portions are removed with chemical solvents (developers) leaving a hole in the resist layer corresponding to the pattern on the mask.

The second transfer takes places from the photoresist layer into the master surface layer as follows. The patterned photoresist layer is sputter coated with a layer of metal. Then a metal film such as a nickel film is electroplated on the sputter deposited metal layer. The metal film is peeled off and it has a topography pattern corresponding to the pattern on the mask. This metal film is used as the master. The master is laid on a magnetic disk and exposed to a magnetic field to create a magnetic pattern in the magnetic layer of the magnetic medium.

The selection of a photoresist depends on several factors. The primary driving force is the dimensions required on the master surface. The resist must first have the capability of producing those dimensions. Beyond that it must also function as an etch barrier during the etching step, a function that requires a certain thickness for mechanical strength, it must be free of pinholes, which also requires a certain thickness. In the embodiment described above, an etch process is not necessarily required. However, the master has a certain thickness. In addition, it must adhere to the top wafer surface or the pattern will be distorted, just as a paint stencil will give a sloppy image if it is not taped tight to the surface. These, along with process latitude and step coverage capabilities, are resist performance factors. In the selection of a resist, one often must make trade-off decisions between the various performance factors. The photoresist is one part of a system of chemical processes and equipment that must work together to produce the image results and be productive, that is, an acceptable cost of ownership for the whole patterning process.

Resolution capability: The smallest opening or space that can be produced in a photoresist layer is generally referred to as its resolution capability. The smaller the line produced, the better the resolution capability. Resolution capability for a particular resist is referenced to a particular process including the exposing source and developing process. Changing the other process parameters will alter the inherent resolution capability of the resist. Generally, smaller line openings are produced with a thinner resist film thickness. However, a resist layer must be thick enough to function as an and be pinhole-free. The selection of a resist thickness is a trade-off between these two goals. The capability of a particular resist relative to resolution and thickness is measured by its aspect ratio. The aspect ratio is calculated as the ratio of the resist thickness to the image opening. Positive resists have a higher aspect ratio compared to negative resists, which means that for a given image-size opening, the resist layer can be thicker. The ability of positive resist to resolve a smaller opening is due to the smaller size of the polymer. It is a little like the requirement of using a smaller brush to paint a thinner line.

Adhesion capability: In its role as an etch barrier, a photoresist layer must adhere well to the surface layer to faithfully transfer the resist opening into the layer. Lack of adhesion results in distorted images. Resists differ in their ability to adhere to the various surfaces used in chip fabrication. Within the photomasking process, there are a number of steps that are specifically included to promote the natural adhesion of the resist to the wafer surface. Negative resists generally have a higher adhesion capability than positive resists.

Photoresist exposure speed, sensitivity, and exposure source: The primary action of a photoresist is the change in structure in response to an exposing light or radiation. An important process factor is the speed at which that reaction takes place. The faster the speed, the faster the wafers can be processed through the masking area. Negative resists typically require 5 to 15 seconds of exposure time, while positive resists take three to four times longer. The sensitivity of a resist relates to the amount of energy required to cause the polymerization or photosolubilization to occur. Further, sensitivity relates to the energy associated with specific wavelength of the exposing source. Understanding this property requires a familiarization with the nature of the electromagnetic spectrum. Within nature we identify a number of different types of energy: light, short and long radio waves, x-rays, etc. In reality they are all electromagnetic energy (or radiation) and are differentiated from each other by their wavelengths, with the shorter wavelength radiation having higher energies.

Common positive and negative photoresists respond to energies in the ultraviolet and deep ultraviolet (DUV) portion of the spectrum. Some are designed to respond to particular wavelength peaks within those ranges. Some resists are designed to work with x-rays or electron beams (e-beam). Resist sensitivity, as a parameter, is measured as the amount of energy required to initiate the basic reaction. The units are milijoules per square centimeter ($mJ/cm^2$). The specific wavelengths the resist reacts to are called the spectral response characteristic of the resist. The peaks in the spectrum are regions (wavelengths) that carry higher amounts of energy.

Process latitude: While reading the sections on the individual masking process steps, the reader should keep in mind the fact that the goal of the overall process is a faithful reproduction of the required image size in the wafer layer(s). Every step has an influence on the final image size and each of the steps has inherent process variations. Some resists are more tolerant of these variations, that is, they have a wider process latitude. The wider the process latitude, the higher the probability that the images on the wafer will meet the required dimensional specifications.

Pinholes: Pinholes are microscopically small voids in the resist layer. They are detrimental because they allow to seep through the resist layer and etch small holes in the surface layer. Pinholes come from particulate contamination in the environment, the spin process, and from structural voids in the resist layer.

The thinner the resist layer, the more pinholes. Therefore, thicker films have fewer pinholes but they also make the resolution of small openings more difficult. These two factors present one of the classic trade-offs in determining a process resist thickness. One of the principal advantages of positive resists is their higher aspect ratio, which allows a thicker resist film and a lower pinhole count for a given image size.

Particle and contamination levels: Resists, like other process chemicals must meet stringent standards for particle content, sodium and trace metal contaminants, and water content.

Thermal flow: During the masking process there are two heating steps. The first, called soft bake, evaporates solvents from the resist. The second one, hard bake, takes place after the image has been developed in the resist layer. The purpose of the hard bake is to increase the adhesion of the resist to the wafer surface. However, the resist, being a plastic-like material, will soften and flow during the hard bake step. The amount of flow has an important effect on the final image size. The resist has to maintain its shape and structure during the bake or the process design must account for dimensional changes due to thermal flow.

The goal of the process engineer is to achieve as high a bake temperature as possible to maximize adhesion. This temperature is limited by the flow characteristics of the resist. In general, the more stable the thermal flow of the resist, the better it is in the process.

The performance factors outlined above are related to a number of physical and chemical properties of the resist. A photoresist is a liquid that is applied to the wafer by a spinning technique. The thickness of resist left on the wafer is a function of the spin step parameters and several resist properties: solids content and viscosity.

The surface tension of a resist also influences the outcome at spin. Surface tension is a measure of the attractive forces in the surface of the liquid. Liquids with high surface tension flow less readily on a flat surface. It is the surface tension that draws a liquid into a spherical shape on a surface or in a tube.

The optical properties of the resist play a role in the exposure mechanism. One property is refraction or the bending of light as it passes through a transparent or semitransparent medium. The index of refraction is a measurement of the speed of light in a material compared to its speed in air. It is calculated as the ratio of the reflecting angle to the impinging angle. Preferably for photoresists, the index of refraction is close to that of glass, approximately 1.45.

Figure 2:
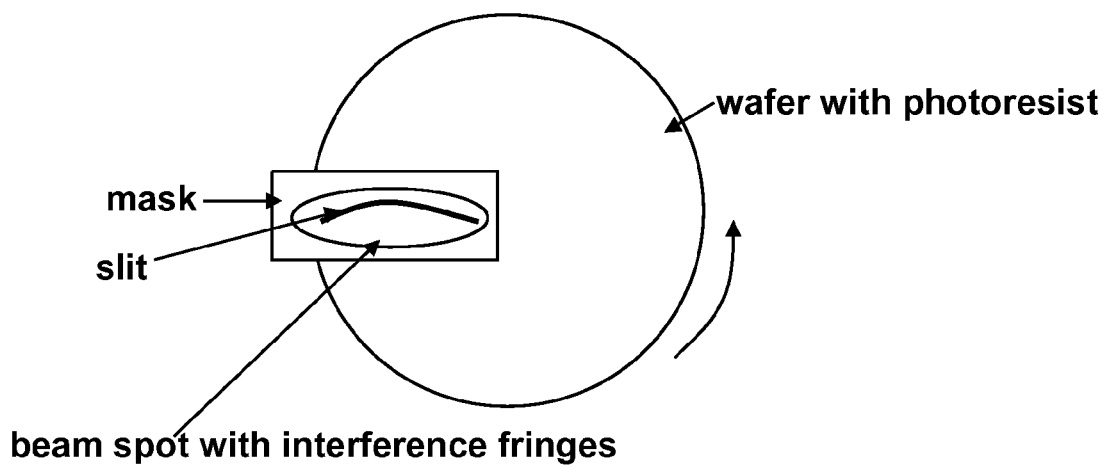
FIG. 2 shows a top view of an embodiment of the RAIL system.

Embodiments of this invention are shown in FIGS. 1 to 4. FIGS. 1 and 2 show the side and top views of an embodiment of a RAIL system. In FIG. 1, two laser beams interfere and expose a photoresist to form a pattern on the photoresist. A beam splitter splits a laser beam into two interfering beams. The RAIL system also preferably has a phase shifter that controls a position of an interference fringe. The photoresist is then chemically developed to create a resist pattern with different depths in the pattern.

Interference lithography (IL) is the preferred method for fabricating periodic and quasi-periodic patterns that must be spatially coherent over large areas. IL is a conceptually simple process where two coherent beams interfere to produce a standing wave, which can be recorded in a photoresist. The spatial-period of the grating can be as fine as half the wavelength of the interfering light, allowing for structures on the order of 100 nm from UV wavelengths, and features as small as 30-40 nm using a deep UV ArF laser, for example.

In particular, it is preferable to control the flexure of the substrate during exposure of the resist. For example, a controlled flexure of the substrate during exposure can reduce the distortion of the pattern from 2 dimensions to 1 dimension as well as reduce the magnitude of the distortions by about a factor of 5.

For spatial periods of the order of 100 nm, one could use a 193 nm wavelength ArF laser. To compensate for the limited temporal coherence of the source, one could utilize an achromatic scheme in which the spatial period of the printed grating is dependent only on the period of the parent gratings used in the interferometer, regardless of the optical path or the wavelength and coherence of the source. Thus, gratings and grids produced with such a tool are extremely repeatable. A 100 nm-period grid can be produced using achromatic interferometric lithography (AIL) on a photoresist. The RAIL system could use AIL, which could be used to produce 50 nm period gratings and grids, or 25 nm lines and spaces using reflection gratings with a 58.4 nm helium discharge source.

Figure 3:
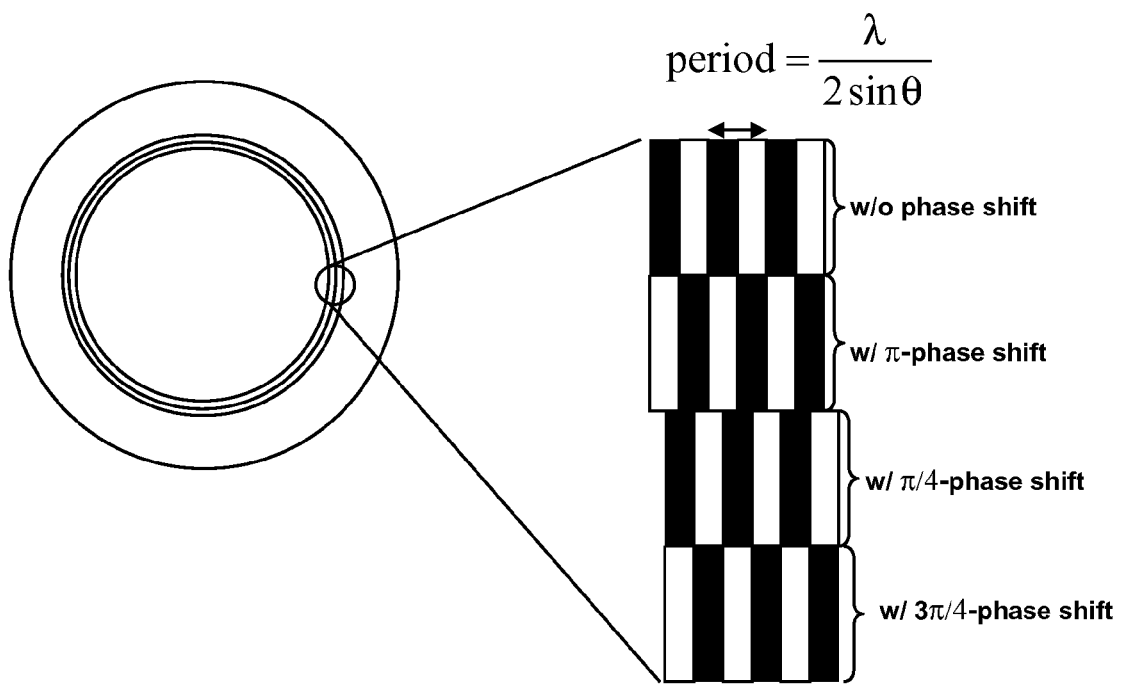
FIG. 3 shows one embodiment of the resulting patterns formed on a photoresist by the RAIL system.

The basic principle is that features in crosstrack direction are defined by interference fringes created by two coherent laser beams. It will create a periodic pattern (lines and spacing), the period of which is determined by $$\text{period} = \frac{\lambda}{2\sin\theta}$$

where $\lambda$ is the wavelength of the laser and $\theta$ is an angle as shown in FIG. 1. For example, with $\lambda=257$ nm and $\theta=80°$, the period can be 130 nm, which is sufficient for 390 kTPI. The period is twice the trackpitch of the servo patterns as shown in FIG. 3, wherein the period is measured from the leading edge of one track to the leading edge of another adjacent track. However, the period could also be measured from any other defined location on one track to another similarly defined location on an adjacent track. For example, the period could be measured from the trailing edge (or center) of one track to the trailing edge (or center) of another adjacent track.

Figure 4:
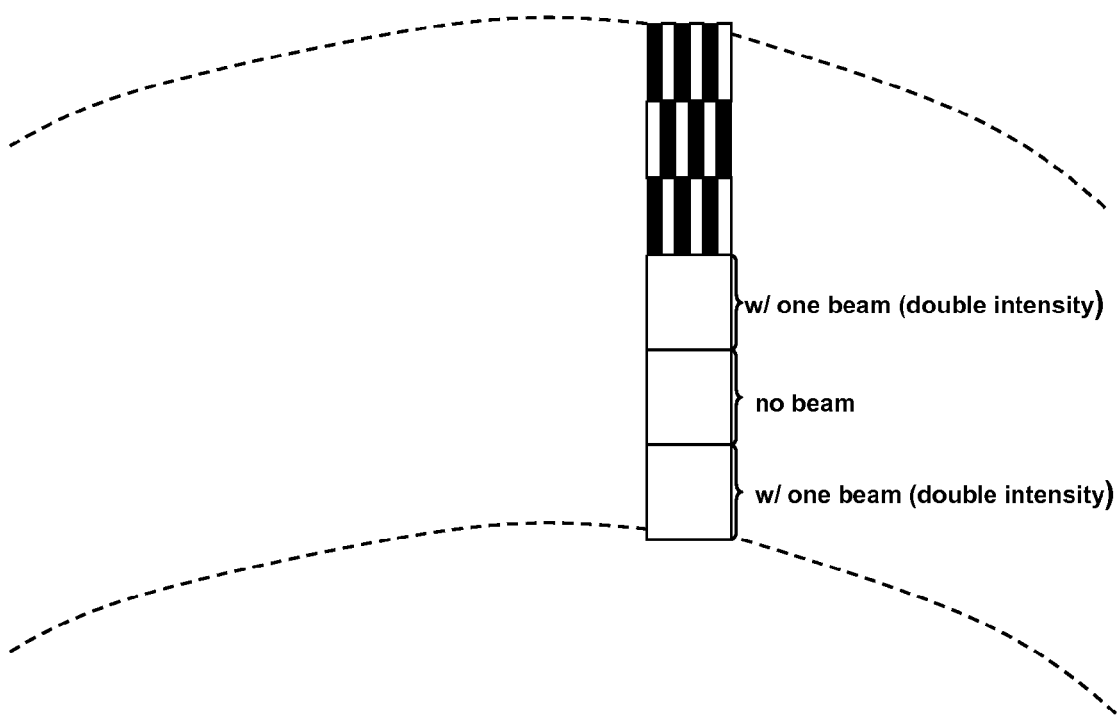
FIG. 4 shows another embodiment of the resulting patterns formed on a photoresist by the RAIL system.

The features in downtrack direction are defined by a slit of the mask confining the exposed area of the beam spot, and the resolution is limited by the diffraction. The patterns as shown in FIGS. 3 and 4 can be made by the combination of the blanking of the laser beam and the incremental rotation of the wafer, for example. The downtrack length of the features is not necessarily as small as the crosstrack length, and can be on the order of μm, which is sufficient for the master for printed-pattern assisted self-servo write.

Shifting the phase of one of the laser beams can make the checkerboard-like patterns as shown in FIG. 3, such that the positions of the constructive and destructive interference change as desired. Only one beam with double intensity, for example, could also be used to make synchronous field patterns. For a printed-pattern assisted self-servo write master, it is not necessary to record gray code fields. Preferably, the shape of the slit can be an arc to mimic the head trajectory in a drive with a rotary actuator.

The master has a substantially uniform period of the pattern with a standard deviation of the period being less than 1 nm, preferably less than 0.5 nm. Current e-beam method results in a standard deviation of the period of about 3-5 nm. The present invention uses an interference method to create the pattern, which will give a standard deviation of the period of less than 1 nm, preferably, less than 0.1 nm. Also, the pattern by the RAIL system has a feature size of less then 0.35 microns, preferably less than 0.3 microns, and more preferably less than 0.25 microns. Current photolithography methods result in a feature size of more than 0.35 microns.

This application discloses several numerical ranges in the text and figures. The numerical ranges disclosed inherently support any range or value within the disclosed numerical ranges even though a precise range limitation is not stated verbatim in the specification because this invention can be practiced throughout the disclosed numerical ranges.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein. Finally, the entire disclosure of the patents and publications referred in this application are hereby incorporated herein by reference.

The invention claimed is:

1. A method of manufacturing a master, comprising:
applying a resist to a substrate;
patterning the resist by interferometric lithography to form a patterned resist, wherein the patterning is performed by a rotary apertured interferometric lithography (RAIL) system comprising an interferometric tool, a rotating stage, at least two interfering laser beams and a mask having an aperture that creates a servo pattern in a master for magnetic-contact printing, wherein the master has a feature having a size of less than 0.35 micron and a standard deviation of a period of the servo pattern is less than 1 nm, wherein the aperture is an arc-shaped slit, and wherein the chord of the arc-shaped slit extends substantially radially from near the center of the rotating stage to near the perimeter of the rotating stage; and
depositing a metal on the patterned resist, wherein the master has a feature having a standard deviation of a period of the feature of less than 1 nm and the master is a master for magnetic-contact printing.

2. The method of claim 1, wherein the depositing a metal comprises sputtering depositing a metal layer and subsequently electroplating a metal film on the metal layer.

3. The method of claim 1, wherein the patterning the resist comprises exposing the resist to a laser beam and developing the resist.

4. The method of claim 1, wherein the patterned resist contains depressions of different depths.

5. The method of claim 1, wherein the feature has a size of less than 0.35 micron.

6. The method of claim 1, wherein the servo-pattern tracks a recording-head trajectory of a hard disk drive.

7. The method of claim 1, further comprising a phase shifter that controls a position of an interference fringe.

8. The method of claim 1, wherein the system forms the servo pattern with a trackpitch determined by a wavelength of the two laser beams and an incident angle of the laser beams.

9. The method of claim 1, wherein a beam splitter splits a laser beam into the two interfering laser beams.

10. The method of claim 1, wherein the two laser beams are produced by a 193 nm wavelength ArF laser.

11. The method of claim 1, wherein the interferometric tool comprises an achromatic interferometric lithography (AIL) tool.

12. The method of claim 11, wherein the AIL tool is adapted to produce a servo pattern having 50 nm period gratings.

13. The method of claim 1, wherein the servo pattern has a period that is determined by $$\text{period} = \frac{\lambda}{2\sin\theta}$$

where $\lambda$ is the wavelength of the laser and $\theta$ is an angle between the normal to the plane of the surface of the rotating stage and one of the two interfering beams.

14. The method of claim 1, further comprising a wafer with a photoresist.

15. The method of claim 1, wherein the servo pattern is a checkerboard pattern.

16. The method of claim 1, wherein the standard deviation of the period of the servo pattern is less than 0.5 nm.

17. The method of claim 1, wherein the feature has a size of less than 0.25 micron.

* * * * *